United States Patent [19]

Grodinsky et al.

[11] Patent Number: 4,597,100

[45] Date of Patent: Jun. 24, 1986

[54] ULTRA HIGH RESOLUTION LOUDSPEAKER SYSTEM

[75] Inventors: Robert M. Grodinsky, Skokie; David G. Cornwell, Chicago, both of Ill.

[73] Assignee: RG Dynamics, Inc., Skokie, Ill.

[21] Appl. No.: 610,607

[22] Filed: May 15, 1984

[51] Int. Cl.[4] .............................................. H03G 5/00
[52] U.S. Cl. ...................................................... 381/99
[58] Field of Search ......................... 381/99, 100, 107; 333/132; 369/175

[56] References Cited

U.S. PATENT DOCUMENTS

| | | | |
|---|---|---|---|
| 1,674,683 | 6/1928 | Hahnemann . | |
| 1,711,529 | 5/1929 | Hahnemann . | |
| 2,054,647 | 9/1936 | Ballantine | 250/30 |
| 2,179,840 | 11/1939 | Bucky . | |
| 2,612,558 | 9/1952 | Klipsch | 178/44 |
| 3,060,264 | 10/1962 | Rojprasit . | |
| 3,457,370 | 7/1969 | Boner . | |
| 3,657,480 | 4/1972 | Cheng . | |
| 3,727,004 | 4/1973 | Bose . | |
| 3,814,857 | 6/1974 | Thomasen . | |
| 3,838,215 | 9/1974 | Haynes . | |
| 3,838,216 | 9/1974 | Watkins . | |
| 3,984,635 | 10/1976 | Nestorovic . | |
| 4,031,321 | 6/1977 | Bakgaard . | |
| 4,064,364 | 12/1977 | Veale . | |
| 4,198,540 | 4/1980 | Cizek . | |
| 4,229,619 | 10/1980 | Takahashi . | |
| 4,243,840 | 1/1981 | Kates . | |
| 4,295,006 | 10/1981 | Tanaka . | |
| 4,340,778 | 7/1982 | Cowans . | |
| 4,475,233 | 10/1984 | Watkins | 381/99 |

FOREIGN PATENT DOCUMENTS

| | | |
|---|---|---|
| 5574292 | 11/1978 | Japan . |
| 57-52295 | 3/1982 | Japan . |
| 836894 | 6/1960 | United Kingdom . |
| 918535 | 2/1963 | United Kingdom . |

*Primary Examiner*—Forester W. Isen
*Attorney, Agent, or Firm*—Nicholas A. Camasto

[57] ABSTRACT

A speaker system includes crossover networks connected to a low output impedance amplifier through RF chokes. The individual outputs of the crossover networks are connected by separate wires to each of the individual speakers. RF reducing capacitors are connected across the terminals of each speaker and across the output terminals of the crossover networks. Separate back EMF resistors are connected across the speakers for dissipating back EMF signal energy. The component values in each of the crossover networks are split and balanced to present a substantially identical electrical configuration to both polarities of signal.

21 Claims, 5 Drawing Figures

ULTRA HIGH RESOLUTION LOUDSPEAKER SYSTEM

FIELD OF THE INVENTION

This invention relates in general to loudspeaker systems and in particular to high resolution high fidelity loudspeaker systems incorporating multiple speakers and crossover networks.

BACKGROUND OF THE INVENTION AND PRIOR ART

The term high resolution is used to mean the ability to correctly portray or reproduce wide ranging dynamic signals, both in relationship to their correct peak values and, very importantly, in the ability to clearly separate extremely low level details of sounds from each other and from system background noise. As will be shown, these qualities are only realizable in systems characterized by minimal signal energy storage and consequently by minimal time-displacement distortions.

These distortion effects may often only be discerned by a discriminating listener using very high quality equipment. Average audio equipment either generates on its own or is prone to so much external distortion that the effects to which the invention is directed are often completely masked. Thus, it should be borne in mind throughout that these distortion effects are in the area below 0.01%, whereas the art is accustomed to dealing with distortions of above 0.1%. However, it is believed that these time-displacement distortions despite their low numerical percentage, give rise to very noticeable listening deficiencies.

If one considers the nature of sound as being "periods of energy" and "periods of silence", the importance of the "periods of silence" immediately becomes apparent. Anything that "fills in" a silent period is, therefore, a form of distortion. It has been discovered that this type of distortion, which is termed time-displacement distortion, is extremely noticeable, even in very small amounts. It has either not been recognized by the prior art or it has been ignored.

There are two types of time-displacement distortion in speaker systems that contribute to the system "noise floor": that due to stored energy in components, i.e., speakers, resistors, capacitors and inductors; and that due to the infusion of radio frequency (RF) energy into the system from the environment. For example, a capacitor that cannot release its stored charge rapidly introduces time-displacement distortion. Similarly, the resonance reaction of an unrestrained speaker is added to that of the sound being produced and generates time-displacement distortion. Further, a speaker is a generator in its own right and ambient sound or sounds from adjacent speakers produce back electromotive force (EMF) signals which are time-displacement distortions. In the area of RF, it is believed that the infusion of this energy interacting in a sub-audible way, is a major contributor to the noise floor of the system and results in an inability to reproduce very low level sounds, either in the presence of, or immediately following, high level sounds. The practical minimum noise floor is that set by the intrinsic electronic noise due to the components in the system. Anything that adds to the system noise floor degrades the system resolution and is a time-displacement distortion. As will also be seen, both types of time-displacement distortions are generally present.

All high fidelity stereo systems use at least two loudspeakers that are connected by a pair of wires to a power amplifier. The lengths of the connecting wires may range from three feet to thirty feet, depending upon the installation, and as such these wires may act as antennas for radiated electromagnetic waves. In urban environments especially, speaker connecting wires may pick up AM, FM, TV and CB signals. Some of the RF signals may be demodulated by nonlinear elements, such as very poor mechanical connections, and result in a clearly-audible gross form of interference. Obviously, RF interference of such magnitude demands corrective action. However, not all RF signals are demodulated to such a degree, or demodulated at all for that matter. While they may not therefore result in audible interference, they represent signal energy that is added to the noise floor and which adversely affects the amplifier and other circuitry by seriously restricting the dynamic range of reproducible signals. In speaker systems of high resolution and accuracy, such effects are quite noticeable.

One prior art solution to reducing gross RF interference has been to enclose the speaker leads with a shield connected to the amplifier "ground" and thereby prevent the infusion of the energy. In an ideal environment, this may be adequate. However, as a practical matter, it is difficult to obtain consistently good RF ground connections and, as will be seen, any failure to do so will increase time-displacement distortion even though ameliorating the gross interference.

In instances of such gross RF interference, various types of filters have been used, such as line filters for removing extraneous RF and other noise from the power lines supplying the system. Some filters have been sold for insertion between the amplifier and speakers for removing gross RF interference. As will be seen, these types of filters are totally unsuitable for use in high resolution speaker systems since their inherent characteristics actually contribute to the generation of the time-displacement distortions which this invention is intended to eliminate.

What the prior art has not realized is that even when no interference is audible, the infusion of RF energy into the system and on the connecting wires between the speaker and the amplifier degrades the clarity and dynamic range of the audio system. These time-displacement distortion induced reductions in fidelity are often quite substantial and give rise to very noticeable, albeit subjective, feelings of "mushiness" and "compression" in the reproduced audio information.

Most speaker systems divide the audio spectrum into two or more frequency bands by means of so called crossover networks. Signals in the different frequency bands are applied to individual speaker drivers that are optimized for those particular frequencies. It is well known that the size of a speaker required to move a given amount of air is in proportion to the wavelength of sound. Since the wavelength of sound increases with lower frequencies and decreases with higher frequencies, the size of a low frequency speaker driver is much greater than the size of a speaker driver designed to reproduce signals in the middle or higher registers. Similarly, it is well known that the peak-to-peak motion of a speaker driver required to produce a given sound pressure is inversely proportional to frequency, for any given size speaker driver. Consequently, as is well known, the distortion produced by speaker mechanical and magnetic nonlinearities also increases with lower frequencies. While many techniques have been used to improve the linearity of low frequency speaker drivers, distortion below 100 Hz is still very high—as much as five to twenty percent in most instances.

A major, generally unrecognized, distortion factor is that due to back EMF interactions between the low frequency speaker drivers, which are especially prone to high distortion, and the midrange and upper frequency drivers. This results in time-displacement distortion in that some of the higher order distortion products, generated by the low frequency speaker driver, are added to the drive signals supplied to the higher frequency speaker drivers. In the same way, audio signals that impinge on the speaker cones, cause the speakers to act as microphones and in turn to produce back EMF electrical signals which, when added to the electrical drive signals, result in time-displacement distortion.

The back EMF's of the speakers should ideally be suppressed to preclude interactions with other speakers and components. In accordance with an aspect of the invention, this is accomplished with frequency-independent energy dissipation means, generally in the form of resistors, coupled in the electrical circuit of the speaker. As will be seen, these back EMF current shunts have values ranging from 1.5 to 5 times the impedance of the speaker drivers, depending upon the characteristics of the speakers and the environment. Since the resistors are frequency-independent, out-of-band back EMF energy dissipation is obtained, which is believed to be the major factor in the improvement observed over prior art systems with crossovers. The back EMF shunts will, of course, generate heat since they dissipate energy. Conventional speaker "loading" devices, i.e., inductors in crossover networks, are frequency related and therefore ineffective against out-of-band back EMF energy and, of course, can not dissipate such energy. Crossover networks, therefore, change the "loading" on their separate speaker drivers because these loading effects are frequency related. Use of the back EMF shunts taught by this invention, in conjunction with the crossover networks, substantially eliminates such changes in loading effect by dissipating the time-displaced energy.

The so-called "Bi-Amp" (also "Tri-Amp") configuration was an attempt to overcome many of the speaker loading problems associated with crossover networks. In these multiple amplifier approaches, separate amplifiers were used for different ranges of frequencies and in turn drove their associated speakers. Such systems were capable of much better control of speaker loading and were also free from the phase problems associated with passive crossover networks. Such an arrangement minimized the back EMF interactions of the speaker, although it was apparently not generally recognized. Their use is obviated by the system of the invention.

The art has also not apparently appreciated the additive nature of many small distortion producing elements on high resolution speaker systems. Mechanical junctions that are clearly rectifying in nature are, of course, obviously bad. But, as this invention shows, all mechanical connections are suspect and should be appropriately treated. Further, when the dynamic signal handling capability is increased by application of the principles of the invention to reduce time-displacement distortions, the effects of the previously hidden, i.e., masked, minor distortion producing elements become all too clear.

Capacitors are prime examples of elements that can be major sources of time-displacement distortion, especially due to RF energy infusion. Thus, a capacitor that is specified herein as an RF capacitor, and indicated in the drawing with curved lines rather than straight lines, needs to be "linear", that is, exhibit a linear voltage-charge relationship, at least up to 20 MHz and must have a low dielectric energy absorption. It will also be clear from this discussion that audio capacitors should also be linear and exhibit low energy absorption. This latter characteristic is directly related to the ability of the capacitor to give up its charge quickly. Capacitors that do not exhibit this characteristic introduce energy storage which gives rise to time-displacement distortion of the signal and compression of the dynamic range of the system. The RF capacitors illustrated may be 0.001 to 0.02 microfarad mica, glass or high quality film types.

Prior art filtering attempts using capacitors to eliminate gross RF signal interference were counterproductive with regard to time-displacement distortions. Indeed the use of ceramic-type disc capacitors connected to "ground" would very seriously degrade a high resolution audio system by introducing time-displacement distortion due to their extreme non-linearity.

Every mechanical connection should be individually determined to be good or bypassed by an RF capacitor. Resistors should, of course, be wire wound or of equal quality. Carbon resistors are totally unacceptable because of their notorious susceptibility to changes in pressure, whether electrical or mechanical. Such changes increase the energy storage of the system and give rise to time-displacement distortions. The internal terminations of wire wound resistors are very important and should be bypassed, if there is any doubt. Once the concept of time-displacement distortion, either by electrical or mechanical energy storage of components or by RF energy raising the system noise floor is grasped, the need for careful attention to each potential distortion source is apparent.

It has also been discovered that even very small amounts of time-displacement distortions become much more noticeable in unsymmetrical networks, that is, in networks that do not electrically "look the same" to both polarities of audio signals. This phenomenon is believed due to unsymmetrical audio signals impacting less-than-ideal components and thereby emphasizing, in a differential way, the non-linearity. These effects are also seen in connection with the effects of infusion of RF signal energy. It has been determined, for example, that drawn wire has a preferential "direction" for minimization of distortion with audio signals, probably due to the molecular grain orientation determined in the drawing process and the inherently unsymmetrical nature of audio signals. While this phenomenon is not fully understood, the effect of reversing improperly oriented wire is clearly perceptible to discerning listeners.

The asymetrical nature of audio signals has a significant impact on crossover networks. A large reduction in time-displacement distortion can be achieved in crossover networks that are "split and balanced" to appear electrically identical to either polarity of signal.

It is thus apparent that the prior art leaves much to be desired with respect to high resolution loudspeaker systems. The invention, in its various aspects, recognizes and provides solutions for the major deficiencies of the prior art.

OBJECTS OF THE INVENTION

A principal object of this invention is to provide an improved high resolution high fidelity loudspeaker system.

Another object of this invention is to provide a novel speaker system arrangement that is resistant to heretofore unrecognized sources of distortion.

A further object of this invention is to provide a speaker system having greatly improved distortion and linearity characteristics.

SUMMARY OF THE INVENTION

In accordance with a fundamental aspect of the invention, a multiple speaker system includes a plurality of speakers operable in different frequency ranges, crossover networks coupling individual ones of the speakers to the output of an amplifier, and connecting wires connecting the speakers with the crossover networks and the amplifier. The system includes means for reducing time-displacement distortions to thereby enhance the resolution of sound reproduced by the speakers.

The invention, in a specific aspect, is directed to reducing the coupling of extraneous RF energy impinging on the connecting wires of the system and includes RF coupling reduction means for reducing the distortion effects caused by interaction between the extraneous RF signals and the amplifier and components.

Another specific aspect of the invention is directed to minimizing the signal energy storage of the system with frequency independent back EMF energy dissipation means.

BRIEF DESCRIPTION OF THE DRAWINGS

These and other objects of the invention will become apparent upon reading the following description thereof in conjunction with the drawings in which.

DESCRIPTION OF THE PREFERRED EMBODIMENT

Figure 1:
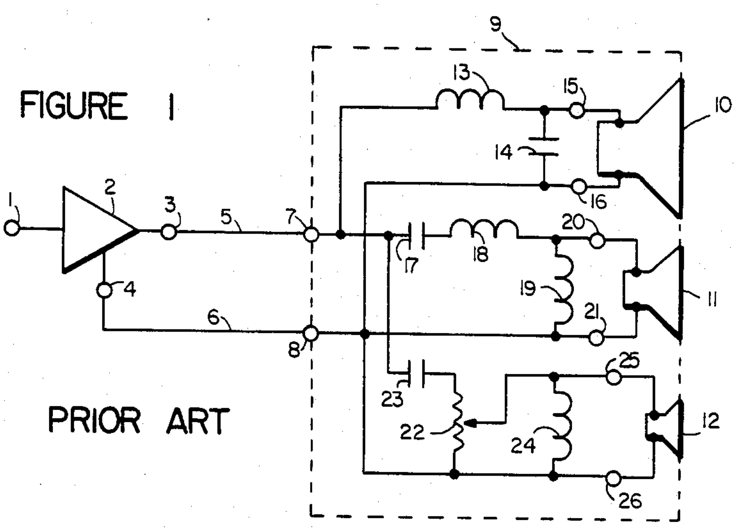
FIG. 1 is a schematic diagram of a multiple speaker and crossover network installation of the prior art.

Referring to the prior art circuit illustrated in FIG. 1, there is shown an input terminal 1 for coupling audio signals to a power amplifier 2 having an output terminal 3 and an output return terminal 4. A pair of connecting wires 5 and 6 couples amplifier terminals 3 and 4 to a pair of speaker system input terminals 7 and 8, respectively. A dashed line block 9 indicates a speaker enclosure or housing. In accordance with standard audio technique, the crossover networks are located inside enclosure 9 along with the speakers. There are, of course, instances where the crossover networks are situated on the outside of the speaker enclosure, but most often, the networks are inside. The speaker system illustrated is a three-way configuration including a "woofer" or low frequency speaker 10, a midrange speaker 11 and a "tweeter" or high frequency speaker 12. Woofer 10 has two connection terminals 15 and 16. Terminal 15 is coupled through an inductor 13 to speaker system input terminal 7 and terminal 16 is directly connected to speaker system input terminal 8. A capacitor 14, coupled across connection terminals 15 and 16, together with inductor 13, forms a crossover network which diverts high frequency signals from low frequency speaker 10. Similarly, mid-range speaker 11 is connected to speaker system input terminals 7 and 8 by a crossover network comprising a capacitor 17 and a pair of inductors 18 and 19. The output of this crossover network is coupled to speaker terminals 20 and 21. The tweeter is precluded from receiving low frequencies by means of another crossover including a series capacitor 23 and a parallel inductor 24 coupled across the tweeter at speaker terminals 25 and 26. A potentiometer 22 is included in the network for adjusting the signal level to the tweeter. It may be noted that all three speakers have their lower terminals (16, 21 and 26) connected in common to speaker system input terminal 8. Conventionally, terminal 7 may be considered "positive" and terminal 8 "negative".

The resistance of connecting wires 5 and 6 is, of course, dependent upon their length and diameter. Generally, for copper wire, the resistance is in the range of from 0.05 ohm to 1.0 ohm. For example, 15 feet of No. 16 stranded copper wire has a resistance of 0.12 ohm. This is a representative length of connecting wire in a typical speaker installation and the No. 16 wire size is typical of that used to connect speakers in high quality audio systems. The effective "output impedance" of the power amplifier is generally in the range of 0.04 ohm to 0.50 ohm.

The many difficulties associated with the prior art speaker systems have been previously mentioned. In one, the speaker connecting wires act as antennas and can pick up a broad range of undesirable RF signals from AM, FM, CB and TV transmissions. The magnitude of these undesirable signals varies with the length and position of the speaker connecting wires and, of course, with the signal strength. While signal strength is also a function of the distance between the antenna and the transmitter, in an average urban environment, these extraneous RF signals are generally strong enough to significantly impact the system noise floor and cause discernible distortions and loss of dynamic range in the audio signals reproduced by high quality systems. Some of this distortion is generated by the extraneous signals being supplied back to the amplifier and appearing at its terminals 3 and 4. Since most amplifiers use some form of negative feedback which compares input and output signals, any RF signals present at terminal 3 are injected into the input circuit of the amplifier via the negative feedback loop (not shown). While RF signals are too high in frequency to be amplified by the power amplifier circuits, they do add to the system noise floor. The desired audio is effectively algebraically added to the noise floor which causes the amplifier input stages to overload on peaks and to mask low level sounds. The result is similar to that of the "mixer" circuit in a superheterodyne tuner with the notable exception that in this instance a random array of RF signals is combined with the audio signals. In this respect, vacuum tube circuits exhibit a great deal more immunity since the overload point of the grid of a vacuum tube is several hundred to a thousand times greater than that of a bipolar transistor. This may explain why many socalled "audiophiles" even today prefer vacuum tube power amplifiers over transistor power amplifiers. Indeed, very expensive vacuum tube amplifiers are still being manufactured for the extremely critical listener.

A source of gross audible distortion is due to rectification of extraneous RF signals at mechanical connections in the wiring of the speaker system. Obviously the connections at terminals 3, 4, 7 and 8 must be mechanical to provide needed flexibility in assembling and positioning the speaker system and amplifier components. The individual terminals on the speakers, namely terminals 15, 16, 20, 21, 25 and 26 are generally mechanical connectors, as is the movable wiper on potentiometer 22. Each mechanical connection in the system can give rise to small but noticeable increases in distortion since each small "bit" adds to the noise floor.

Another problem with the prior art circuit is caused by a loss of "speaker damping" and the introduction of undesirable phase shifts by the crossover networks. The necessary isolation characteristics of crossover networks, which limit the range of frequencies to which each speaker is subjected, result in a high impedance between the power amplifier and the speaker drivers at the so-called "out-of-band" frequencies which are rejected or discriminated against. As a result, speaker damping is adversely affected by the very nature of crossover networks. As will be seen, there is a lot of energy at these out-of-band frequencies and failure to dissipate it seriously degrades the accuracy of reproduction because of time displacement distortions.

Figure 2:
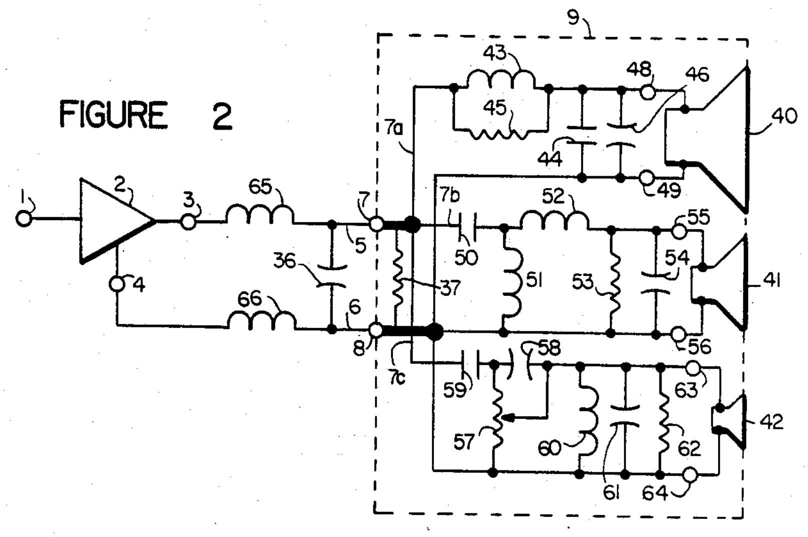
PRIOR ART FIGURE 2
FIG. 2 is a schematic diagram showing the application of the principles of one aspect of the invention to a multiple speaker system where the crossover networks are situated at the speaker location.

FIG. 2 depicts a three-way speaker system constructed in accordance with one aspect of the invention in which both RF and back EMF induced time displacement distortions are substantially eliminated. Amplifier 2 again includes output terminals 3 and 4. An RF choke 65 is connected between output terminal 3 and speaker connecting wire 5 and an RF choke 66 is connected between output terminal 4 and speaker connecting wire 6. A shunt capacitor 36 is connected to the junctions of RF chokes 65 and 66 with connecting wires 5 and 6, respectively. The RF chokes and the capacitor are positioned in close proximity to amplifier terminals 3 and 4. The RF chokes may have values between 5 and 25 microhenries and the capacitor a value of between 0.002 and 0.02 microfarads and together they act to reduce the amount of RF energy, picked up by speaker connecting wires 5 and 6, that is coupled back to the power amplifier. As illustrated by 7*a*, 7*b* and 7*c*, all wires to the crossover networks are separately run to terminals 7 and 8. This is indicated by the heavy lines from terminals 7 and 8 to the junctions of the wires. Additional small RF capacitors, in the range of 0.001 to 0.02 microfarads, and suitable for bypassing RF as discussed above, are illustrated by reference characters 46, 54 and 61 and are connected across the terminals of each speaker. Another RF bypass capacitor 58 is connected across the mechanical slider of potentiometer 57. Further, all of the connections in the networks, including the speaker terminations illustrated as 48, 49, 55, 56, 63 and 64, are preferably soldered or welded. If they are mechanically made terminations, care should be taken to assure good electrical contact. Resistors 45*a*, 45*b*, 53, and 62 have been added to provide both in-band and out-of-band back EMF control. These resistors are frequency-independent, linear shunt circuits for the back EMF currents. For the midrange speaker 41 and the tweeter 42, back EMF shunt resistors 53 and 62 are connected directly across the speaker connections and have values ranging from one to four times the speaker driver impedances. Thus for an 8 ohm impedance system, the resistor values will be between 8 and 30 ohms with about 20 ohms being a good compromise. The exact value is, of course, dependent upon the speaker driver construction and may be adjusted slightly based upon listening evaluations. The back EMF energy dissipation for the low frequency speaker 40 is provided by resistor 45*a* connected in parallel with crossover inductor 43 and by resistor 45*b* connected across the voice coil of speaker 40.

Additionally, it has been found that for reasons that are not as yet clear, the addition of a 100 ohm resistor 37 across terminals 7 and 8 enhances the resolution on quiet audio passages. Resistor 45*a* across inductor 43 provides an added back EMF current shunt in conjunction with the amplifier output impedance. Resistor 45*b*, which is across the speaker, clearly absorbs and dissipates audio energy, whereas resistor 45*a* does not. Since the value of resistor 45*a* limits the crossover high frequency roll off, it cannot be made too small, however. But resistor 45*a* yields a phase correction as an added benefit of this location in the circuit and is the design parameter controlling the value of resistor 45*b*. It has been determined experimentally that the ultimate phase shift of a low pass crossover network produces undesirable acoustic relationships between the attenuated upper end of the woofer where it overlaps into the normal range of the midband speaker. The 90 degree phase shift associated with a single section and the 180 degree phase shift of a two section crossover network are each undesirable. Limiting the phase shift with resistor 45*a* improves the sound of the combined speakers even though the ultimate attenuation is less. The value of resistor 45*a* should be set to range between two and six times the speaker impedance, i.e., 16–50 ohms for an 8 ohm woofer.

It will be appreciated that the back EMF control of the midrange and tweeter speakers cannot be done in this manner since connecting resistors across capacitors 50 and 59 would result in damaging low frequency currents being passed to the midrange and tweeter speakers. Connecting back EMF shunt resistors 45*b*, 53 and 62 directly across the speaker terminals does result in some power loss since these resistors shunt amplifier signal current as well as back EMF currents. However, the improvement in reduction of time-displacement distortions more than outweigh this power loss. The value of the voice coil resistance can be raised so as to maintain the desired total impedance of the combination of back EMF shunt resistor and the voice coil resistance.

The back EMF shunt resistors 45*a*, 45*b*, 53 and 62 supply a non-frequency discriminating "current sink" to each of the drivers in a multiple speaker crossover system. Each of the series connected crossover elements not only discriminates against unwanted frequencies for each driver, but also presents each driver with a high series impedance at the limits of the band pass of the crossover filter. While the power amplifier helps to "sink" back EMF currents, it can do so for each individual driver only over the range of frequencies for which the series connected crossover elements are of low impedance. Thus the amplifier damping is poor for the woofer at mid and high frequencies. For the mid range and tweeter, amplifier damping is poor at low and mid frequencies, respectively. This lack of any appropriate current sink at various frequencies means that any energy present in these drivers at these frequencies will decay slowly, thus contributing to time-displacement distortion by spreading unwanted signal energy out over time.

There are several sources of energy which affect the speaker drivers at the frequencies where the amplifier is "isolated" as a current sink. These include: direct radiation from other speaker drivers in the system whether in the same speaker enclosure or in another speaker set such as its stereo pair; acoustic signals external to the system or reflected back by the room; and shock excitation of the natural mechanical resonances present in all speaker drivers by the transient nature of band-limited audio signals. All of these sources can exist simultaneously to produce time-displacement distortion. The energy dissipated as heat by the back EMF current shunt resistors greatly reduces this cause of distortion.

Another problem still present in the design of FIG. 2 is that while the back EMF shunt resistors provide a local current path for each of the three drivers, this does not completely eliminate all potential coupling effects of the back EMF signals. This back EMF voltage reflects all of the mechanical and magnetic non linearities of the originating speaker. The separate wires *7a*, *7b* and *7c* and their associated separate return wires preclude any common currents to the speakers beyond terminals 7 and 8. If an effective short circuit could be presented to input terminals 7 and 8 of the speaker enclosure, then all of the current due to the back EMF would circulate through this zero impedance and not affect the other speakers. However, even if the power amplifier had an effective output impedance of zero, the resistance of the connecting wires would prevent a zero impedance across input terminals 7 and 8. Thus the combination of a finite amplifier impedance and a finite speaker wire resistance causes an impedance, seen from input terminals 7 and 8 to amplifier 2, of from 0.15 ohms to as much as 3.0 ohms. Thus the out of phase back EMF voltages from the separate speaker drivers are coupled across this common impedance to each of the other speaker drivers. In particular, the low frequency driver of the woofer generates the largest back EMF and the most distortion.

As mentioned, this distortion can range up to 20%. Similarly the midrange speakers also can produce distortion ranging from 0.5 to 10%. While the crossover inductors and capacitors associated with the midrange and tweeter speakers will discriminate against lower frequencies, distortion products in the woofer extend into the midrange and into the higher frequency ranges and thus will pass through the crossovers and be presented to the midrange and tweeter speakers. The distortion products produced by the midrange speaker will also be passed to the tweeter. These distortion products from the lower frequency drivers are quite audible since they are time-delayed relative to the amplifier signal, and are thus time-displacement distortions.

Included in this back EMF distortion is a component that is due to the different response times of each of the speaker driver elements. The woofer has a moving system mass that is much higher than the moving system mass of the midrange speaker and very much higher than the moving system mass of the tweeter speaker. Thus when a broadband audio signal is suddenly applied to speaker input terminals 7 and 8, tweeter 42 moves first, followed by midrange speaker 41 and lastly by woofer speaker 40. The back EMF signal generated by the woofer will thus lag behind the other back EMF signals generated by the midrange and tweeter speakers and present an out-of-phase drive signal to each of the other speakers. The energy storage effects of these time-displaced distortion signals are quite noticeable and undesirable and mask fine detail in the audio information. Additionally the "attack" or rate of change of transient sounds is noticeably compromised.

Figure 3:
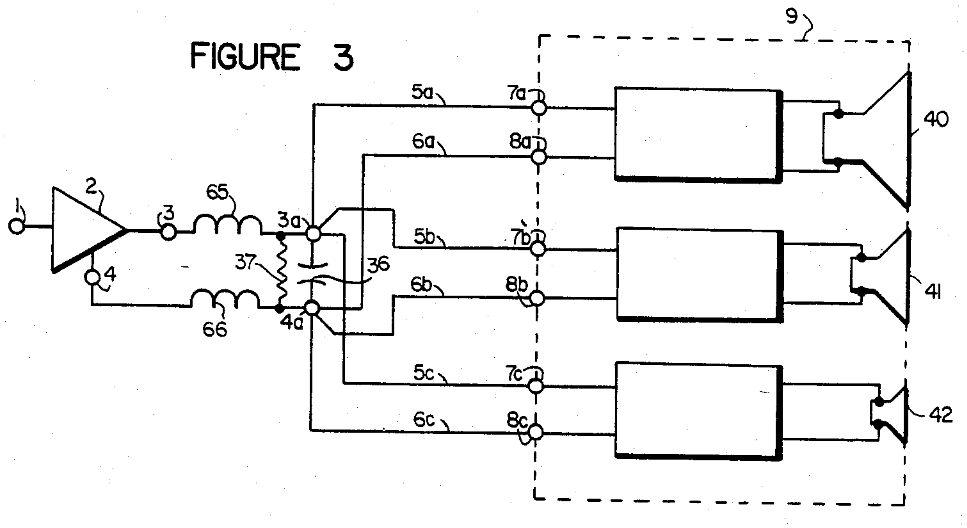
FIG. 3 is a schematic diagram showing the application of the principles of another aspect of the invention to the circuit of FIG. 2.

FIG. 3 illustrates another aspect of the invention which reduces back EMF coupling between speakers. The pair of wires 5 and 6 are replaced by individual pairs of wires *5a-6a*, *5b-6b* and *5c-6c* connected together at one end to terminals *3a* and *4a* and individually connected at the other end to crossover network terminals *7a-8a*, *7b-8b*, and *7c-8c*, respectively. In this arrangement, the common impedance seen by the speakers is presented by the amplifier output impedance and RF chokes 65 and 66, which again are included for reducing RF energy coupled to the amplifier. The 100 ohm resistor 37 is shown coupled across terminals *3a* and *4a*.

Figure 4:
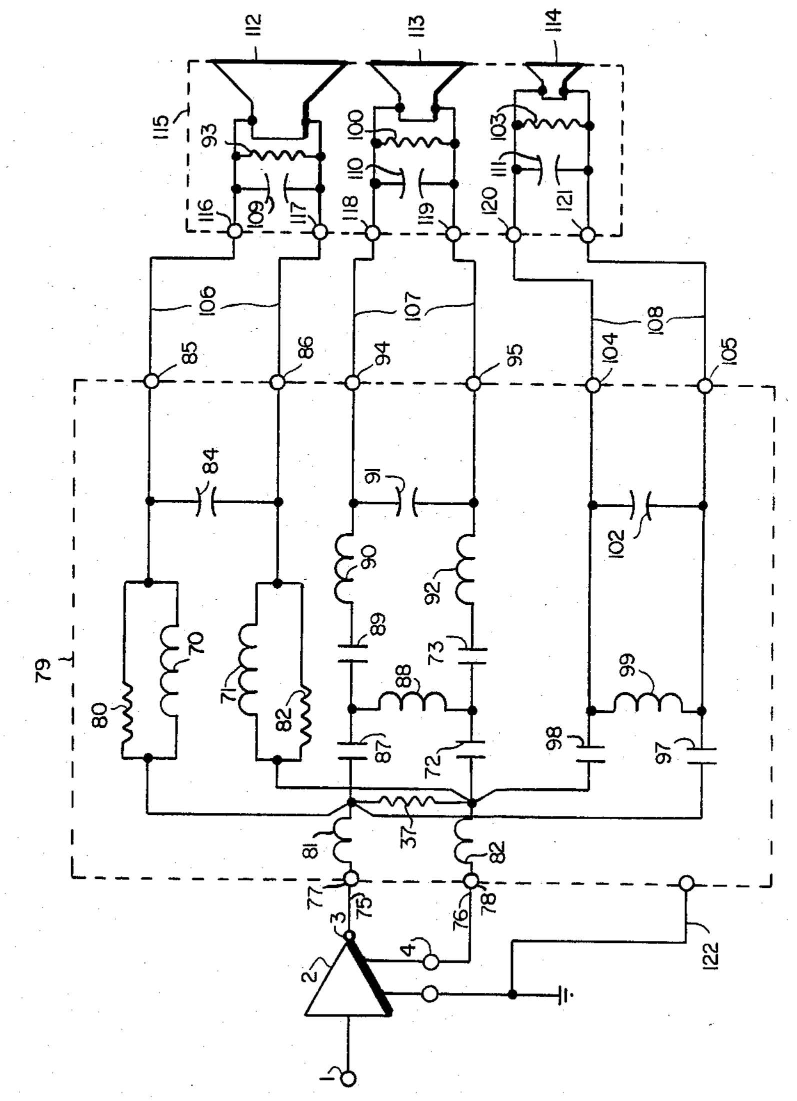
FIG. 4 is a schematic diagram of a multiple speaker and crossover network installation illustrating a further aspect of the invention.

FIG. 4 illustrates yet another aspect of the invention; namely, the use of split and balanced crossover networks. A separate ground, as illustrated on amplifier 2, is provided for connection to an RF shielded enclosure 79 that houses all of the crossover elements. The enclosure is mounted very close to the amplifier and is coupled thereto by short, large, that is low resistance, connecting wires 75 and 76. These wires are connected to the crossover input terminals 77 and 78. Here again, RF chokes 81 and 82 are provided to reduce the amount of RF energy that is coupled back to the amplifier. The three crossover networks are brought out to separate pairs of output terminals. Thus, the low frequency network supplies output terminals 85 and 86, the midrange network supplies output terminals 94 and 95 and the high frequency or tweeter network supplies output terminals 104 and 105. A speaker enclosure 115 is positioned a convenient distance from the crossover networks and is connected thereto by three separate pairs of wires 106, 107 and 108 for the woofer, midrange and tweeter, respectively. This use of separate wires was mentioned earlier. The driver of each speaker has a small RF capacitor connected directly across it as illustrated by capacitors 109, 110 and 111. Back EMF current shunt resistors 93, 100 and 103 are likewise connected across the respective drivers. Again the actual speaker connections are preferably soldered, but electrically sound mechanical connections can be satisfactory.

The inductance in the low frequency crossover network is divided in two, that is, into two separate inductors 70 and 71 and each separate inductor is included in one of the leads to the woofer. Thus both polarities of signal "see" the same electrical configuration. Back EMF shunt resistors 80 and 82 of equal values are connected across inductors 70 and 71, respectively. These resistors provide non-frequency dependent damping for the woofer as mentioned previously. The crossover rate of the crossover network coupled to the woofer is 6 dB per octave and the back EMF shunt resistors 80 and 82 limit the phase shift to less than 90 degrees.

In the midrange network, a pair of series capacitors 87 and 89, in conjunction with an inductor 88, form an 18 dB per octave low frequency cutoff filter for the midrange speaker 113. While it is appreciated that the lower end of the midrange crossover should preferably be 6 dB per octave, this is seldom practical due to power handling considerations. While a 12 dB per octave roll off may be used, the 18 dB per octave rate is much better for power handling and phase considerations. To roll off the upper end of the midrange section, inductors 90 and 92, of equal value, are individually inserted in each current path. An RF bypass capacitor 91 is coupled across midrange crossover network terminals 94 and 95. The crossover inductors 90 and 92 help to reduce coupling of RF energy to the terminals of amplifier 2. Further, as mentioned, the crossover is housed in a shielded enclosure which is connected to the ground of the amplifier chassis by a wire 122. The crossover includes inductors in each circuit "leg" for symmetry purposes. If this is not done, benefits are correspondingly reduced. Locating the crossover close to the amplifier also greatly reduces coupled RF signals because the crossover elements present impedance to the flow of RF energy.

A pair of capacitors 72 and 73 have been added to the return line of the midrange crossover network for symmetry purposes. The values of capacitors 87 and 89 should be increased accordingly to compensate for this series connection. While no presently satisfactory explanation exists, the crossover networks are decidedly better when they are symmetrical, as far as quality of audio reproduction is concerned. This is also true for the inductors and their back EMF shunt resistors, as illustrated in the figure. Thus, the tweeter crossover network includes symmetrical crossover capacitors 97 and 98. Back EMF resistor 103 and RF capacitor 111 are both connected across the tweeter terminals 120 and 121.

The back EMF current shunt resistors of FIGS. 2 and 4 should not be confused with level adjustment variable resistors of the prior art, as exemplified by variable resistor 57 in FIG. 2. The back EMF shunt resistors provide a resistive, that is, non-frequency dependent, load which more than compensates for the loss of amplifier damping which the crossover networks impose at some frequencies due to their rising series impedance. It is most undesirable to increase series impedance, which isolates the speakers from the power amplifiers. Any form of level adjustment increases the series resistance and thus reduces the system resolution. If level adjustments are needed for the mid range and tweeter, acoustic attenuators should be provided, for example, plastic foam driver covers.

Figure 5:
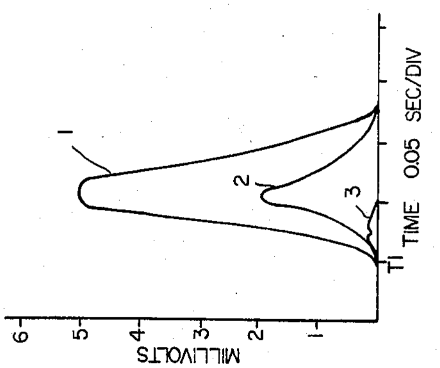
FIG. 5 is a series of curves illustrating the back EMF's generated by speakers in the various circuit arrangements of FIGS. 1-3.

As shown, the back EMF shunt resistors are preferably located across the individual driver terminals or as close thereto as possible. Since the back EMF voltages are small and it is desirable for the back EMF currents to be circulated through the back EMF resistors down to micro ampere levels, the linearity of these resistors is important. For this reason, adjustable resistors should not be used as back EMF current shunts since with time the mechanical connections become nonlinear enough to affect the resolution levels. The reactive shunt crossover impedances cannot function as back EMF current shunts since they do not dissipate power. Energy stored in the speaker drivers and transformed back into back EMF currents can only be reduced by conversion into heat. Thus, only resistors can reduce the time-displacement distortion energy. Here again, separating the current paths from each speaker results in the only common impedance for the speakers being the short, large leads 75 and 76. This greatly reduces the coupling of any back EMF signals from one speaker to another if the output impedance of the amplifier is low, as it usually is with modern feedback amplifiers. The magnitude of this reduction in coupled back EMF signal between drivers is illustrated in FIG. 5. With an amplifier of 0.2 ohms output impedance, a fairly typical woofer of 12" diameter and ten ounce magnet structure, has its voice coil mechanically deflected 0.25" and released at a time indicated as T1. The graphs show the voltage across the terminals of the midrange speaker due to the back EMF produced by the woofer. A 6 dB per octave crossover was used with the woofer and a 12 dB per octave crossover with the midrange speaker. Curve 1 of FIG. 5 illustrates the back EMF voltage generated for the prior art circuit of FIG. 1. Curve 2 illustrates that generated for the improved circuit of FIG. 2, but one in which a substantial impedance common to the speakers is still included because the crossover network is situated at the speaker rather than at the amplifier. In curve 3 the effect produced with the circuits of FIGS. 3 and 4 is illustrated. The difference is quite demonstrable with almost complete elimination of back EMF coupling. The addition of back EMF shunt resistors results in additional improvement since the back EMF signals are attenuated at their sources.

The benefits obtained by the arrangement of FIG. 3 are nearly as great as those obtained with FIG. 4. The obvious advantages of the FIG. 2 and FIG. 3 embodiments are that they are usable with existing high quality speaker systems to reduce coupling of RF signals, without necessitating a rearrangement of the crossover networks. Redoing the crossover networks to take advantage of symmetry for example, will enable the benefits of reduced back EMF interaction to be obtained.

The effect of the RF improvements reduces the coupling of extraneous RF signals, that are picked up by the relatively long speaker connecting wires, back to the amplifier. Extending separate wires to each speaker from a point close to the low impedance amplifier output minimizes back EMF problems and, in conjunction with the back EMF shunt resistors, provides nonreactive speaker damping which also controls the phase shifts introduced by the crossovers. The use of symmetry in the crossover design further enhances resolution of time-displacement distorton effects. The combination results in a new level of speaker resolution, exhibiting great accuracy and freedom from time-displacement distortion.

It is recognized that numerous changes in the described embodiment of the invention will be apparent to those skilled in the art without departing from the true spirit and scope thereof. The invention is to be limited only as defined in the claims.

What is claimed is:

1. An ultra high resolution speaker system comprising:

- a low output impedance audio amplifier having a pair of output terminals;
- a plurality of speakers operable in different frequency ranges including a low frequency audio speaker;
- a plurality of crossover networks coupling said plurality of speakers to the output terminals of said amplifier;
- connecting wires, susceptible to impingement by extraneous RF signal energy, interconnecting the speakers, the crossover networks and the amplifier terminals;
- RF suprression means for reducing the amount of RF energy coupled to said amplifier output terminals;

frequency independent energy dissipation means connected in circuit with at least said low frequency speaker;

said frequency independent energy dissipation means being resistive and said RF suppression means including a first Rf choke positioned close to said amplifier and connected in series with one of said output terminals, the crossover network for said low frequency speaker including an inductor, said dissipation means including a resistor connected in parallel with said inductor, and a second RF choke positioned close to said amplifier and connected in series with the other of said output terminals and wherein said crossover network includes a plurlity of inductors and capacitors that are split and balanced to substantially electrically impose the same loading on either polarity of signal applied thereto.

2. The system of claim 1 further including a back EMF reducing resistor connected directly across the terminals of said low frequency speaker, said resistor having a value in the range of a 1.5 to 5 times the impedance of said low frequency speaker.

3. The system of claim 2 further including back EMF reducing resistors connected across the speaker terminals of said plurality of speakers in said system.

4. The system of claim 3 further including an additional resistor of approximately 100 ohms connected in shunt with the crossover input.

5. In a multiple speaker system of the type including a plurality of speakers operable in different frequency ranges, crossover networks coupling said plurality of speakers to the output terminals of an audio amplifier and connecting wires interconnecting the speakers, the crossover networks and the amplifier terminals, said connecting wires being susceptible to impingement by extraneous RF signal energy, the improvement comprising:

means for reducing time-displacement distortions and preserving the system noise floor, said means reducing the energy storage of the components of said speaker system and including RF suppression means for reducing the coupling of said RF energy to said amplifier, said suppression means comprising at least one RF choke connected in series between one of said output terminals and said crossover networks and being positioned close to said amplifier and wherein said crossover networks are positioned close to said speakers and wherein a second RF choke is connected in series between the other of said output terminals of said amplifier and said crossover networks.

6. The system of claim 5 wherein said crossover networks include inductors and capacitors that are split and balanced to substantially electrically impose the same loading on either polarity of signals applied thereto.

7. The system of claim 6, further including mechanical connections, wherein said RF suppression means include RF capacitor means coupled across said mechanical connections.

8. The system of claim 6 further including a resistor of approximately 100 ohms connected in shunt with the crossover input.

9. In a multiple speaker system of the type including a plurality of speakers operable in different frequency ranges, crossover networks coupling said plurality of speakers to the output terminals of an audio amplifier and connecting wires interconnecting the speakers, the crossover networks and the amplifier terminals, said connecting wires being susceptible to impingement by extraneous RF signal energy, the improvement comprising:

means for reducing time-displacement distortions and preserving the system noise floor, said means reducing the energy storage of the components of said speaker system and including RF suppression means reducing the coupling of said RF energy to said amplifier, said RF suppression means comprising at least one RF choke connected in series between one of said output terminals and said crossover networks and being positioned close to said amplifier, said crossover networks being positioned close to said amplifier output terminals and separate pairs of connecting wires extending between each of said speakers and its respective one of said crossover networks and wherein a second RF choke is connected in series between the other of said output terminals and said crossover networks.

10. The system of claim 9 wherein said crossover networks include inductors and capacitors that are split and balanced to substantially electrically impose the same loading on either polarity of signals applied thereto.

11. The system of claim 10, further including mechanical connections, wherein said RF suppression means include RF capacitor means coupled across said mechanical connections.

12. The system of claim 11 further including a resistor of approximately 100 ohms connected in shunt with the crossover input.

13. In a multiple speaker system of the type including a plurality of speakers operable in different frequency ranges, crossover networks coupling said plurality of speakers to the output terminals of an audio amplifier and connecting wires interconnecting the speakers, the crossover networks and the amplifier terminals, the improvement comprising:

means for reducing time-displacement distortions and preserving the system noise floor, said means reducing the energy storage of the components of said speaker system and including frequency independent energy dissipation means connected in circuit with at least the low frequency one of said speakers, said energy dissipation means comprising at least one resistor and wherein said crossover networks include inductors and capacitors that are split and balanced to substantially electrically impose the same loading on either polarity of signal applied thereto.

14. The system of claim 13, wherein said connecting wires interconnecting the output terminals of said amplifier, said crossover networks and said speakers are adapted to reduce back EMF coupling of said speakers.

15. The system of claim 14 wherein said crossover networks are located near said speakers and said connecting wires include individual pairs of conductors between the output terminals of said amplifier and each of said crossover networks.

16. The system of claim 14 wherein said crossover networks are located near said amplifier and said connecting wires include short, large conductors between the amplifier terminals and the crossover networks and individual pairs of conductors from each crossover network and its respective speaker.

17. The system of claim 13 wherein said frequency independent dissipation means comprises a resistor connected across the low frequency one of said speakers as close as possible to its voice coil termination.

18. The system of claim 17 further including dissipation resistors connected in parallel with said inductors of said crossover networks.

19. The system of claim 18 wherein a dissipation resistor is connected across each speaker as close as possible to its voice coil termination.

20. The system of claim 19 wherein a dissipation resistor of about 100 ohms is connected across the input to said crossover networks.

21. The system of claim 20 wherein said crossover networks are located close to said amplifier and further including individual pairs of conductors extending from each of said crossover networks to respective ones of said speakers.

* * * * *